(12) United States Patent
Ootsuka et al.

(10) Patent No.: US 11,635,469 B2
(45) Date of Patent: Apr. 25, 2023

(54) POWER SUPPLY DEVICE

(71) Applicant: TOYOTA JIDOSHA KABUSHIKI KAISHA, Toyota (JP)

(72) Inventors: Kazuo Ootsuka, Nagakute (JP); Shuji Tomura, Nagakute (JP); Naoki Yanagizawa, Nagakute (JP); Kyosuke Tanemura, Nagakute (JP); Shigeaki Goto, Nagakute (JP); Junta Izumi, Nagoya (JP); Kenji Kimura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 468 days.

(21) Appl. No.: 16/656,772

(22) Filed: Oct. 18, 2019

(65) Prior Publication Data

US 2020/0132780 A1  Apr. 30, 2020

(30) Foreign Application Priority Data

Oct. 31, 2018  (JP) .............................. JP2018-204648

(51) Int. Cl.
*G01R 31/387*  (2019.01)
*G01R 31/36*  (2020.01)
*H02J 7/00*  (2006.01)

(52) U.S. Cl.
CPC ....... *G01R 31/387* (2019.01); *G01R 31/3648* (2013.01); *H02J 7/0068* (2013.01)

(58) Field of Classification Search
USPC .......................................................... 702/63
See application file for complete search history.

(56) References Cited

U.S. PATENT DOCUMENTS

| 5,389,843 | A | 2/1995 | McKinney |
| 6,240,082 | B1 | 5/2001 | Kim et al. |
| 9,322,883 | B2 | 4/2016 | Danner |
| 9,647,463 | B2 | 5/2017 | Brandl et al. |
| 9,866,054 | B2 | 1/2018 | Lee |
| 2004/0198468 | A1 | 10/2004 | Patel et al. |
| 2005/0083016 | A1 | 4/2005 | Yau et al. |
| 2007/0001651 | A1 | 1/2007 | Harvey |

(Continued)

FOREIGN PATENT DOCUMENTS

| CN | 106847156 A | 6/2017 |
| JP | 2008282236 A | 11/2008 |

(Continued)

OTHER PUBLICATIONS

European Search Report dated Dec. 4, 2019, for EP Patent Application No. 19204314.

(Continued)

*Primary Examiner* — Ricky Go
(74) *Attorney, Agent, or Firm* — Dickinson Wright, PLLC

(57) ABSTRACT

Provided is a power supply device which includes a plurality of battery modules each having a secondary battery and in which the battery modules are connected in series with one another according to a gate driving signal from a controller. An SOC control target value that is a target value for states-of-charge of the battery modules is changed according to the number of the battery modules that are available to be connected in series.

5 Claims, 8 Drawing Sheets

(56) References Cited

U.S. PATENT DOCUMENTS

| | | | |
|---|---|---|---|
| 2009/0085520 A1* | 4/2009 | Murao | H02J 7/0016 320/134 |
| 2010/0141209 A1 | 6/2010 | Shiu et al. | |
| 2011/0025270 A1 | 2/2011 | Nakanishi | |
| 2011/0057617 A1 | 3/2011 | Finberg et al. | |
| 2011/0080138 A1 | 4/2011 | Nakanishi | |
| 2013/0002016 A1 | 1/2013 | Furukawa et al. | |
| 2013/0026993 A1 | 1/2013 | Hintz et al. | |
| 2013/0108898 A1 | 5/2013 | Potts et al. | |
| 2013/0249317 A1 | 9/2013 | Kang et al. | |
| 2014/0021923 A1 | 1/2014 | Uchida | |
| 2014/0176104 A1 | 6/2014 | Lin et al. | |
| 2015/0104673 A1 | 4/2015 | de Greef et al. | |
| 2015/0115736 A1 | 4/2015 | Snyder | |
| 2016/0233709 A1 | 8/2016 | Lee | |
| 2016/0254667 A1 | 9/2016 | Lee | |
| 2016/0276854 A1 | 9/2016 | Lian | |
| 2017/0040646 A1 | 2/2017 | Beaston | |
| 2017/0077558 A1 | 3/2017 | Nystrom et al. | |
| 2017/0126032 A1 | 5/2017 | Beaston | |
| 2017/0163250 A1 | 6/2017 | Tokuhiro et al. | |
| 2017/0163268 A1 | 6/2017 | Maeda et al. | |
| 2017/0288431 A1 | 10/2017 | Lian | |
| 2018/0313902 A1 | 11/2018 | Nagasue | |
| 2019/0057828 A1 | 2/2019 | Gurtner et al. | |
| 2019/0181661 A1 | 6/2019 | Shen | |
| 2019/0190282 A1 | 6/2019 | Zheng et al. | |
| 2019/0267896 A1 | 8/2019 | Goto et al. | |
| 2019/0288520 A1* | 9/2019 | Abdel-Monem | H02J 7/0029 |
| 2019/0361075 A1 | 11/2019 | Lee et al. | |
| 2019/0363311 A1 | 11/2019 | Crowley et al. | |
| 2020/0076206 A1 | 3/2020 | Goto et al. | |
| 2020/0112183 A1 | 4/2020 | Tomura et al. | |
| 2020/0128745 A1 | 4/2020 | Bueermann | |
| 2020/0132780 A1 | 4/2020 | Ootsuka et al. | |
| 2020/0136196 A1 | 4/2020 | Tanemura et al. | |
| 2020/0136199 A1 | 4/2020 | Yanagizawa et al. | |
| 2020/0136405 A1 | 4/2020 | Goto et al. | |
| 2020/0136412 A1 | 4/2020 | Tomura et al. | |
| 2020/0166576 A1 | 5/2020 | Yasoshima et al. | |
| 2020/0169080 A1 | 5/2020 | Yasoshima et al. | |
| 2020/0169081 A1 | 5/2020 | Yasoshima et al. | |
| 2020/0169082 A1 | 5/2020 | Yasoshima et al. | |
| 2020/0169115 A1 | 5/2020 | Yasoshima et al. | |
| 2020/0176982 A1 | 6/2020 | Yasoshima et al. | |
| 2020/0176983 A1 | 6/2020 | Yasoshima et al. | |
| 2020/0177018 A1 | 6/2020 | Yasoshima et al. | |
| 2020/0177019 A1 | 6/2020 | Yasoshima et al. | |
| 2020/0177178 A1 | 6/2020 | Yasoshima et al. | |
| 2020/0303785 A1 | 9/2020 | Chang et al. | |
| 2021/0050734 A1 | 2/2021 | Huot-Marchand et al. | |
| 2021/0075227 A1 | 3/2021 | Chang | |
| 2021/0184474 A1 | 6/2021 | Kobayashi | |
| 2021/0203178 A1 | 7/2021 | Tsukada et al. | |

FOREIGN PATENT DOCUMENTS

| | | |
|---|---|---|
| JP | 2013135477 A | 7/2013 |
| JP | 2013179739 A | 9/2013 |
| JP | 2014143771 A | 8/2014 |
| JP | 2018-074709 A | 5/2018 |
| KR | 101241532 B1 | 3/2013 |
| WO | 2013/035963 A1 | 3/2013 |
| WO | 2018/041141 A1 | 3/2018 |
| WO | 2018/079664 A1 | 5/2018 |
| WO | 2018179774 A1 | 10/2018 |

OTHER PUBLICATIONS

Shuji Tomura et al., U.S. Appl. No. 16/654,998, filed Oct. 16, 2019.

Shuji Tomura et al., U.S. Appl. No. 16/654,998, Non-Final Office Action dated Sep. 20, 2021.

Shuji Tomura et al., Office Action issued to U.S. Appl. No. 16/654,998 dated Apr. 7, 2022.

Office Action issued to U.S. Appl. No. 16/654,998 dated Oct. 18, 2022.

* cited by examiner

POWER SUPPLY DEVICE

INCORPORATION BY REFERENCE

The disclosure of Japanese Patent Application No. 2018-204648 filed on Oct. 31, 2018 including the specification, drawings and abstract is incorporated herein by reference in its entirety.

BACKGROUND

1. Technical Field

The present disclosure relates to a power supply device that has battery modules connected in series and supplies electric power.

2. Description of Related Art

Power supply devices that have a plurality of battery modules connected in series and supply a load with electric power (power a load) are used. When the batteries included in the battery modules are secondary batteries, the power supply device can also charge these batteries from the load side (regenerate electric power).

For such power supply devices, a configuration including a switching circuit that connects and isolates the battery module to and from a load based on a gate driving signal has been proposed. In this circuit configuration, voltage control is performed by driving the switching circuit of each battery module through a gate driving signal via a delay circuit (Japanese Patent Application Publication No. 2018-074709).

SUMMARY

In the conventional power supply devices, an equal current flows through each of the series-connected battery modules. One problem is that under the condition where the battery modules vary in performance, the state-of-charge (SOC) of a battery module with a smaller battery capacity becomes low faster than the states-of-charge of the other battery modules. A further problem is that when the SOC of a battery module decreases to a lower limit threshold value, this battery module becomes unusable. Moreover, an increase in the number of battery modules that have become unusable sometimes leads to a situation where the power supply device itself needs to be stopped.

One aspect of the present disclosure relates to a power supply device including: a plurality of battery modules, each battery module having a secondary battery; and a controller configured to connect the battery modules in series with one another according to a gate driving signal, and to change an SOC control target value that is a target value for states-of-charge of the battery modules according to the number of the battery modules that are available to be connected in series.

Here, the controller may be configured to set the SOC control target value higher as the number of the battery modules that are available to be connected in series becomes smaller.

The power supply device may further include a disconnecting device that forcibly isolates the battery module from the series connection regardless of the gate driving signal. The controller may be configured to exclude, from the battery modules that are available to be connected in series, the battery module that has been forcibly isolated from the series connection by the disconnecting device.

The controller may be configured to determine whether or not the battery module is in a failed state by using state information showing a state of the battery module. The disconnecting device may forcibly isolate, from the series connection, the battery module that has been determined to be in the failed state.

The controller may be configured to estimate the SOC of each of the battery modules based on the state information; to determine the battery module whose SOC has decreased to or below a threshold value to be in a failed state; and to set the SOC control target value such that a total value of voltages of the battery modules that are available to be connected in series, except for the battery module that has been forcibly isolated by the disconnecting device, becomes equal to or larger than a target output voltage value.

The gate driving signal may be transmitted to the battery modules, from an upstream side toward a downstream side, while being delayed in a gate driving signal processing circuit included in each of the battery modules.

The present disclosure makes it possible for a power supply device that has battery modules connected in series and supplies electric power, to maintain an electric power output voltage and continue operation by changing the SOC control target value, as a target for the battery modules, according to the number of the battery modules that are available to be connected.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
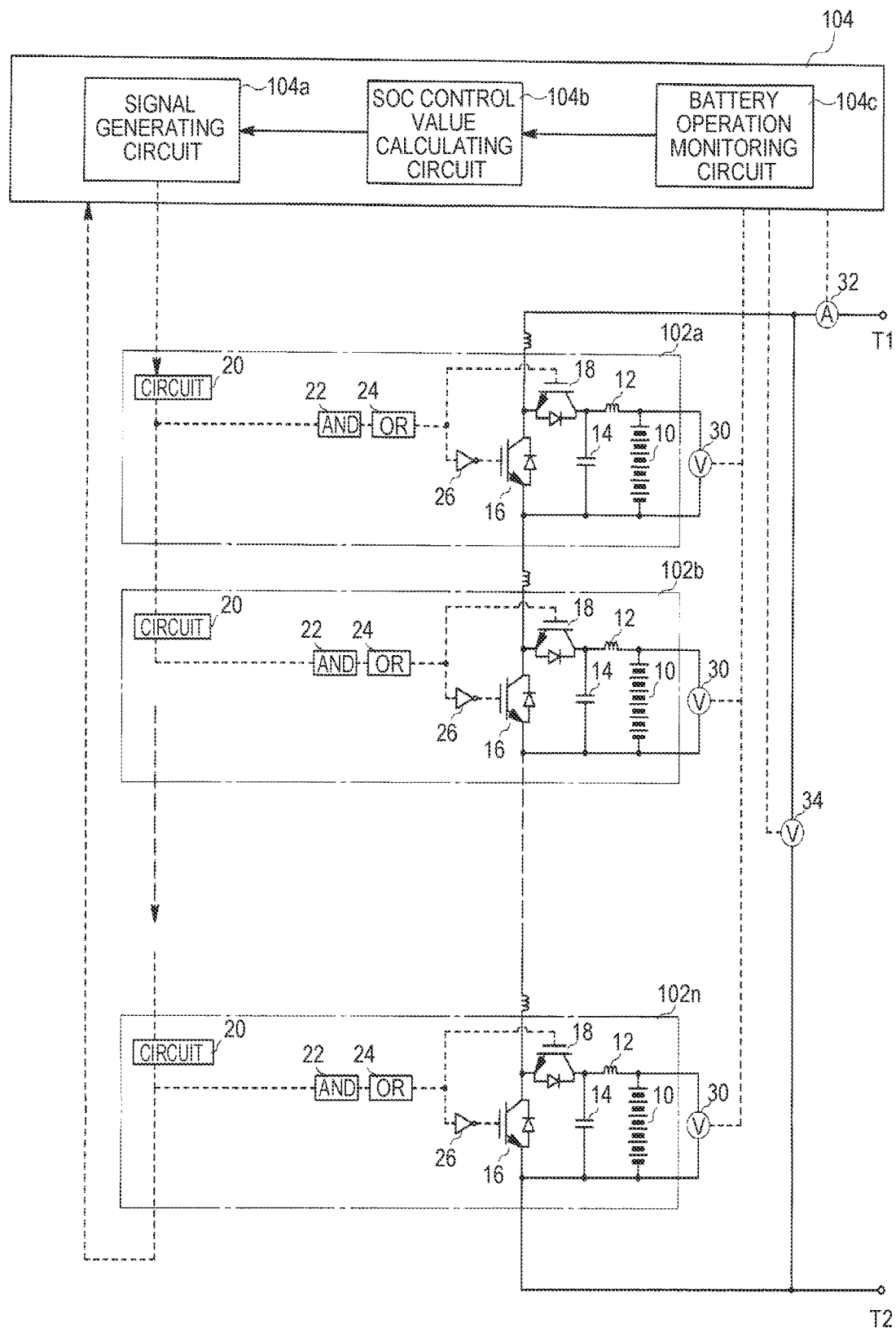
FIG. 1 is a diagram showing the configuration of a power supply device in an embodiment of the present disclosure.

As shown in FIG. 1, a power supply device 100 in an embodiment includes battery modules 102 and a controller 104. The power supply device 100 includes a plurality of battery modules 102 (102a, 102b, . . . 102n). The battery modules 102 can be connected in series with one another under control by the controller 104. The battery modules 102 included in the power supply device 100 can supply a load (not shown) connected to terminals T1, T2 with electric power (power the load), or can be charged with electric power from a power source (not shown) connected to the terminals T1, T2 (regenerate electric power).

The battery module 102 includes a battery 10, a choke coil 12, a capacitor 14, a first switch element 16, a second switch element 18, a gate driving signal processing circuit 20, an AND element 22, an OR element 24, and an NOT element 26. In this embodiment, the battery modules 102 have the same configuration.

The battery 10 includes at least one secondary battery. For example, the battery 10 can have a configuration in which a plurality of lithium-ion batteries, nickel-metal hydride batteries, or the like is connected in series or parallel. The choke coil 12 and the capacitor 14 form a smoothing circuit (low-pass filter circuit) that smooths an output from the battery 10 and outputs the smoothed output. That is, a secondary battery is used as the battery 10, and the battery 10 deteriorates as the internal resistance loss increases. To reduce such deterioration, the current is smoothed by an RLC filter formed by the battery 10, the choke coil 12, and the capacitor 14. However, the choke coil 12 and the capacitor 14 are not essential components and may be omitted.

The first switch element 16 includes a switching element for short-circuiting an output terminal of the battery 10. In this embodiment, the first switch element 16 has a configuration in which a freewheeling diode is connected in parallel to a field-effect transistor that is a switching element. The second switch element 18 is connected in series with the battery 10 between the battery 10 and the first switch element 16. In this embodiment, the second switch element 18 has a configuration in which a freewheeling diode is connected in parallel to a field-effect transistor that is a switching element. Switching of the first switch element 16 and the second switch element 18 is controlled through a gate driving signal from the controller 104. While field-effect transistors are used in the first switch element 16 and the second switch element 18 in this embodiment, other switching elements may also be used.

The gate driving signal processing circuit 20 is a circuit that controls the battery module 102 based on the gate driving signal input from a signal generating circuit 104a of the controller 104 into the battery module 102. The gate driving signal processing circuit 20 includes a delay circuit that delays the gate driving signal by a predetermined time. In the power supply device 100, the gate driving signal processing circuits 20 are respectively provided in the battery modules 102 (102a, 102b, . . . 102n) and connected in series with one another. Therefore, the gate driving signal input from the controller 104 is sequentially input into the battery modules 102 (102a, 102b, . . . 102n) while being delayed by a predetermined time at each battery module 102. Control based on the gate driving signal will be described later.

The AND element 22 constitutes a disconnecting device that forcibly isolates the battery module 102a from the series connection according to a forced disconnection signal. The OR element 24 constitutes a connecting device that forcibly connects the battery module 102a to the series connection according to a forced connection signal. The AND element 22 and the OR element 24 are controlled by the gate driving signal processing circuit 20 that has received the forced disconnection signal or the forced connection signal from the controller 104. A control signal from the gate driving signal processing circuit 20 is input into one input terminal of the AND element 22, and the gate driving signal from the gate driving signal processing circuit 20 is input into the other input terminal of the AND element 22. A control signal from the gate driving signal processing circuit 20 is input into one input terminal of the OR element 24, and the gate driving signal from the gate driving signal processing circuit 20 is input into the other input terminal of the OR element 24. Output signals from the AND element 22 and the OR element 24 are input into a gate terminal of the second switch element 18. Output signals from the AND element 22 and the OR element 24 are also input into a gate terminal of the first switch element 16 through the NOT element 26.

During normal control, the gate driving signal processing circuit 20 that has not received the forced disconnection signal or the forced connection signal from the controller 104 inputs a high (H)-level control signal into the AND element 22 and inputs a low (L)-level control signal into the OR element 24. Therefore, the gate driving signal is input as is into the gate terminal of the second switch element 18, while an inverted signal of the gate driving signal is input into the gate terminal of the first switch element 16. Thus, when the gate driving signal level is high (H), the first switch element 16 is turned off and the second switch element 18 is turned on, and when the gate driving signal level is low (L), the first switch element 16 is turned on and the second switch element 18 is turned off. In other words, when the gate driving signal level is high (H), the battery module 102 is put in a state of being connected in series with the other battery modules 102, and when the gate driving signal level is low (L), the battery module 102 is put in a pass-through state of being isolated from the other battery modules 102.

During forced disconnection, the controller 104 sends the forced disconnection signal to the gate driving signal processing circuit 20 of the battery module 102 to be forcibly isolated. Upon receiving the forced disconnection signal from the controller 104, the gate driving signal processing circuit 20 inputs a low (L)-level control signal into the AND element 22 and inputs a low (L)-level control signal into the OR element 24. As a result, a low (L) level is output from the AND element 22, and through the OR element 24, a high (H) level is input into the gate terminal of the first switch element 16 by the NOT element 26 and a low (L) level is input into the gate terminal of the second switch element 18. Thus, the first switch element 16 is put in a normally on state and the second switch element 18 is put in a normally off state, which puts the battery module 102 in a state of being forcibly isolated from the series connection regardless of the state of the gate driving signal (pass-through state).

Such forced disconnection control can be used as control for reducing imbalance in the SOC among the battery modules 102 in the power supply device 100. Specifically, when the power supply device 100 is in a discharging state, the SOC of a battery module 102 taking part in outputting of the power supply device 100 decreases. Putting the battery module 102 in a forced disconnection state can maintain the SOC of this battery module 102. On the other hand, when the power supply device 100 is in a charging state, the SOC of a battery module 102 taking part in charging of the power supply device 100 increases. Putting the battery module 102 in a forced disconnection state can maintain the SOC of this battery module 102.

During forced connection, the controller 104 sends the forced connection signal to the gate driving signal processing circuit 20 of the battery module 102 to be forcibly connected. Upon receiving the forced connection signal from the controller 104, the gate driving signal processing circuit 20 inputs a high (H)-level control signal into the OR element 24 of the battery module 102. As a result, a high (H) level is output from the OR element 24, and a low (L) level is input into the gate terminal of the first switch element 16 by the NOT element 26, while a high (H) level is input into the gate terminal of the second switch element 18. Thus, the first switch element 16 is put in a normally off state and the second switch element 18 is put in a normally on state, which puts the battery module 102 in a state of being forcibly linked to the series connection regardless of the state of the gate driving signal.

Such forced connection control can be used as control for reducing imbalance in the SOC among the battery modules 102 in the power supply device 100. Specifically, when the power supply device 100 is in a discharging state, the SOC of a battery module 102 that is put in a forced connection state can be reduced faster than the SOC of a battery module 102 that is intermittently connected in series according to the gate driving signal. On the other hand, when the power supply device 100 is in a charging state, the SOC of a battery module 102 that is put in a forced connection state can be increased faster than the SOC of a battery module 102 that is intermittently connected in series according to the gate driving signal.

While the power supply device 100 in this embodiment has a configuration in which the AND element 22 and the OR element 24 are controlled by the gate driving signal processing circuit 20, a configuration in which either or both of the AND element 22 and the OR element 24 are directly controlled by the controller 104 may also be adopted.

Normal Control

Control of the power supply device 100 will be described below with reference to FIG. 2. During normal control, a high (H)-level control signal is input from the gate driving signal processing circuit 20 into the AND element 22 of each of the battery modules 102 (102a, 102b, . . . 102n). A low (L)-level control signal is input from the gate driving signal processing circuit 20 into the OR element 24 of each of the battery modules 102 (102a, 102b, . . . 102n). As a result, an output signal from the gate driving signal processing circuit 20 is input as an inverted signal into the gate terminal of the first switch element 16 through the NOT elements 26, while an output signal from the gate driving signal processing circuit 20 is input as is into the gate terminal of the second switch element 18.

Figure 2:
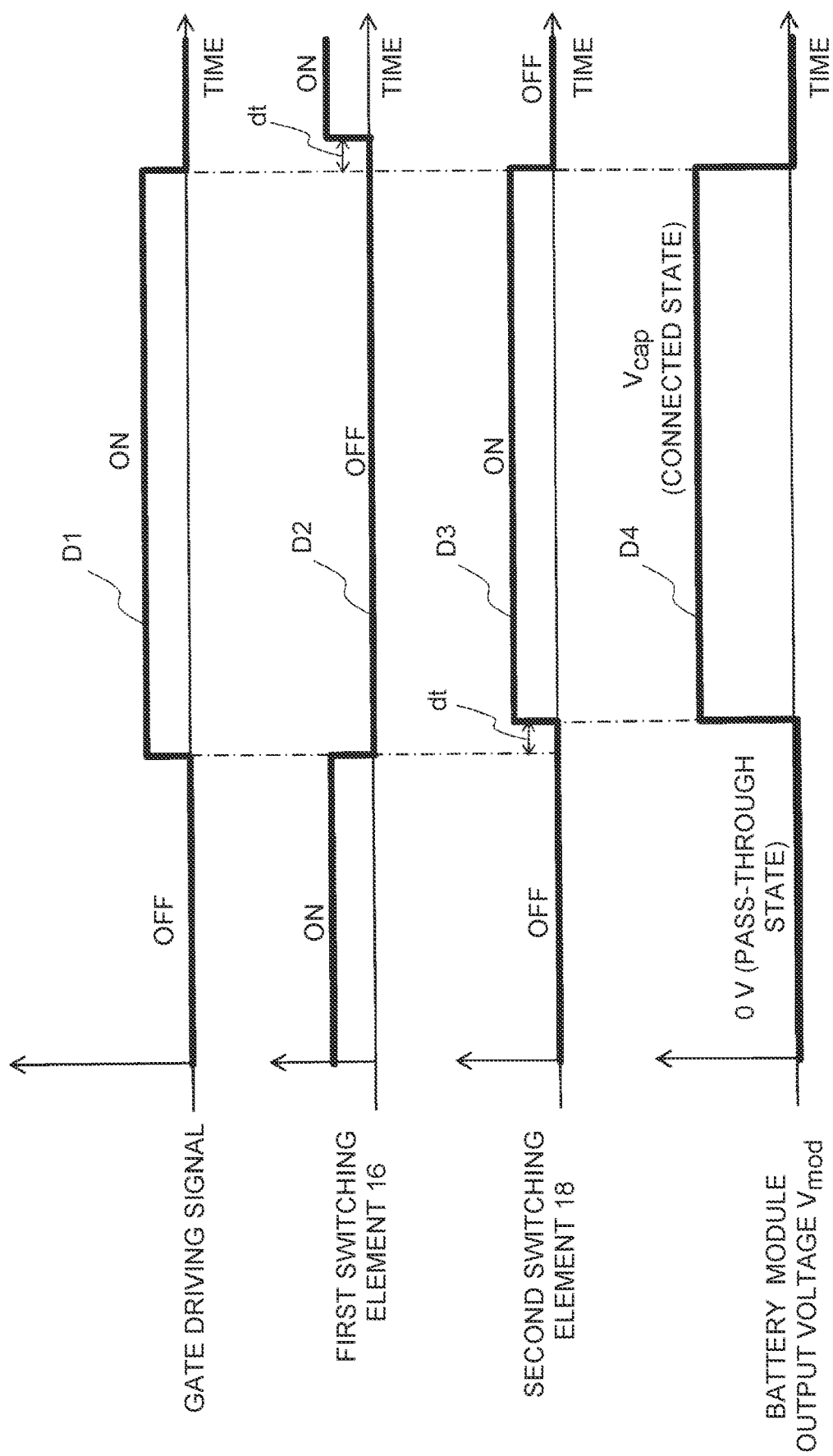
FIG. 2 is a time chart illustrating control of a battery module in the embodiment of the present disclosure.

FIG. 2 is a time chart relating to the operation of the battery module 102a. FIG. 2 shows a pulse waveform of a gate driving signal D1 that drives the battery module 102a, a rectangular wave D2 representing the switching state of the first switch element 16, a rectangular wave D3 representing the switching state of the second switch element 18, and a waveform D4 of a voltage Vmod output from the battery module 102a.

In an initial state of the battery module 102a, i.e., in a state where the gate driving signal is not being output, the first switch element 16 is on and the second switch element 18 is off. When the gate driving signal is input from the controller 104 into the battery module 102a, switching of the battery module 102a is controlled by PWM control. Under this switching control, the first switch element 16 and the second switch element 18 are switched so as to be alternately turned on and off.

As shown in FIG. 2, when the gate driving signal D1 is output from the controller 104, the first switch element 16 and the second switch element 18 of the battery module 102a are driven according to the gate driving signal D1. The first switch element 16 switches from an on state to an off state as the signal from the NOT element 26 falls in response to a rise of the gate driving signal D1. The first switch element 16 switches from an off state to an on state with a delay of a short time (dead time dt) after a fall of the gate driving signal D1.

On the other hand, the second switch element 18 switches from an off state to an on state with a delay of a short time (dead time dt) after a rise of the gate driving signal D1. The second switch element 18 switches from an on state to an off state at the same time that the gate driving signal D1 falls. Thus, switching of the first switch element 16 and the second switch element 18 is controlled such that these switch elements are alternately turned on and off.

It is to prevent the first switch element 16 and the second switch element 18 from being activated at the same time, that the first switch element 16 is activated with a delay of a short time (dead time dt) after a fall of the gate driving signal D1, and that the second switch element 18 is activated with a delay of a short time (dead time dt) after a rise of the gate driving signal D1. Thus, short-circuit resulting from the first switch element 16 and the second switch element 18 turning on at the same time is prevented. The dead time dt that causes a delay in activation is set to 100 ns, for example, but can be set to any appropriate time. During the dead time dt, a current is circulated through the diode, which creates the same state as when a switching element parallel to this diode through which a current circulates is turned on.

Figure 3A:
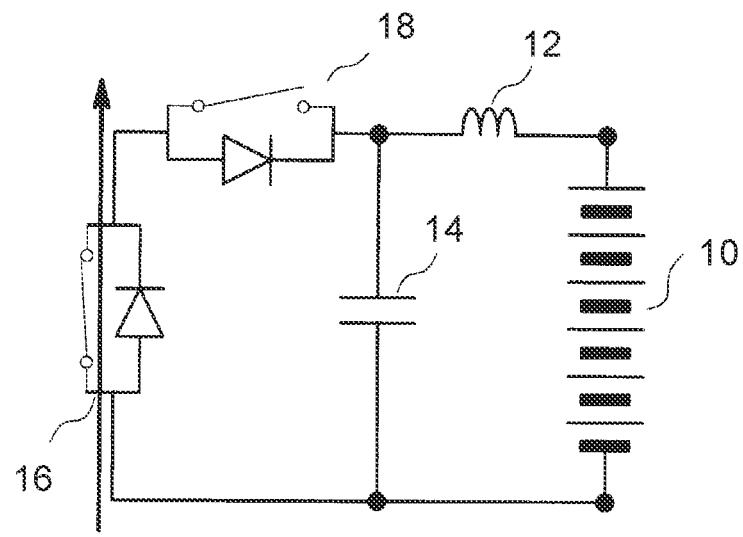
FIG. 3A is a diagram showing the operation of the battery module in the embodiment of the present disclosure.

In the battery module 102a thus controlled, the capacitor 14 is isolated from the output terminal of the battery module 102a when the gate driving signal D1 is off (i.e., the first switch element 16 is on and the second switch element 18 is off). Therefore, no voltage is output from the battery module 102a to the output terminal. In this state, the battery module 102a is in a pass-through state in which the battery 10 (capacitor 14) thereof is bypassed as shown in FIG. 3A.

Figure 3B:
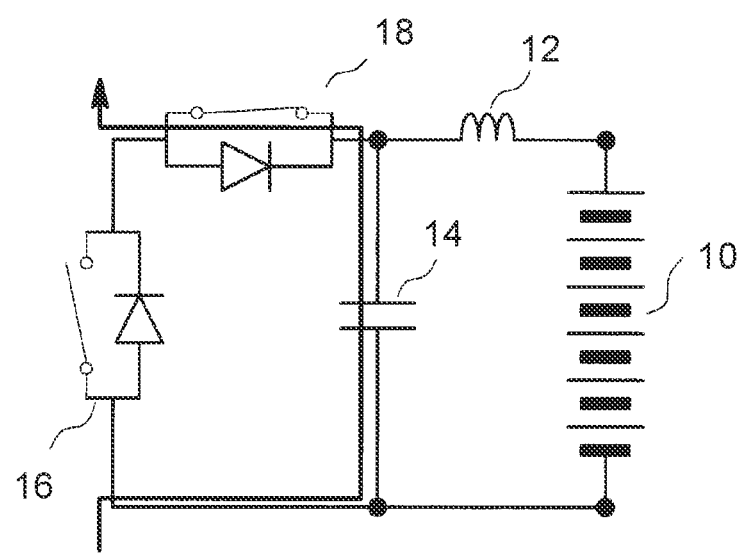
FIG. 3B is a diagram showing the operation of the battery module in the embodiment of the present disclosure.

The capacitor 14 is connected to the output terminal of the battery module 102a when the gate driving signal D1 is on (i.e., the first switch element 16 is off and the second switch element 18 is on). Thus, a voltage is output from the battery module 102a to the output terminal. In this state, the voltage Vmod is output to the output terminal through the capacitor 14 of the battery module 102a as shown in FIG. 3B.

Referring back to FIG. 1, control of the power supply device 100 by the controller 104 will be described. The controller 104 controls all the battery modules 102. By controlling the battery modules 102a, 102b, . . . 102n, the controller 104 controls the output voltage of the power supply device 100 as a whole.

The signal generating circuit 104a of the controller 104 outputs the gate driving signal with a rectangular waveform to each battery module 102. The gate driving signal is sequentially transmitted to the gate driving signal processing circuit 20 included in the battery module 102a, the gate driving signal processing circuit 20 included in the battery module 102b, and so on to the subsequent other battery modules 102. Specifically, the gate driving signal is sequentially transmitted to the battery modules 102 connected in series in the power supply device 100, from a most upstream side toward a downstream side, while being delayed by a predetermined delay time at each battery module 102.

During normal control, a high (H)-level control signal is input into the AND element 22 and a low (L)-level control signal is input into the OR element 24, so that the gate driving signal output from the gate driving signal processing circuit 20 of each battery module 102 is input as is into the gate terminal of the second switch element 18, while an inverted signal of the gate driving signal is input into the gate terminal of the first switch element 16. Thus, when the gate driving signal level is high (H), the first switch element 16 is turned off and the second switch element 18 is turned on, and when the gate driving signal level is low (L), the first switch element 16 is turned on and the second switch element 18 is turned off.

In other words, when the gate driving signal level is high (H), the battery module 102 is put in a state of being connected in series with the other battery modules 102, and when the gate driving signal level is low (L), the battery module 102 is put in a pass-through state of being isolated from the other battery modules 102.

Figure 4:
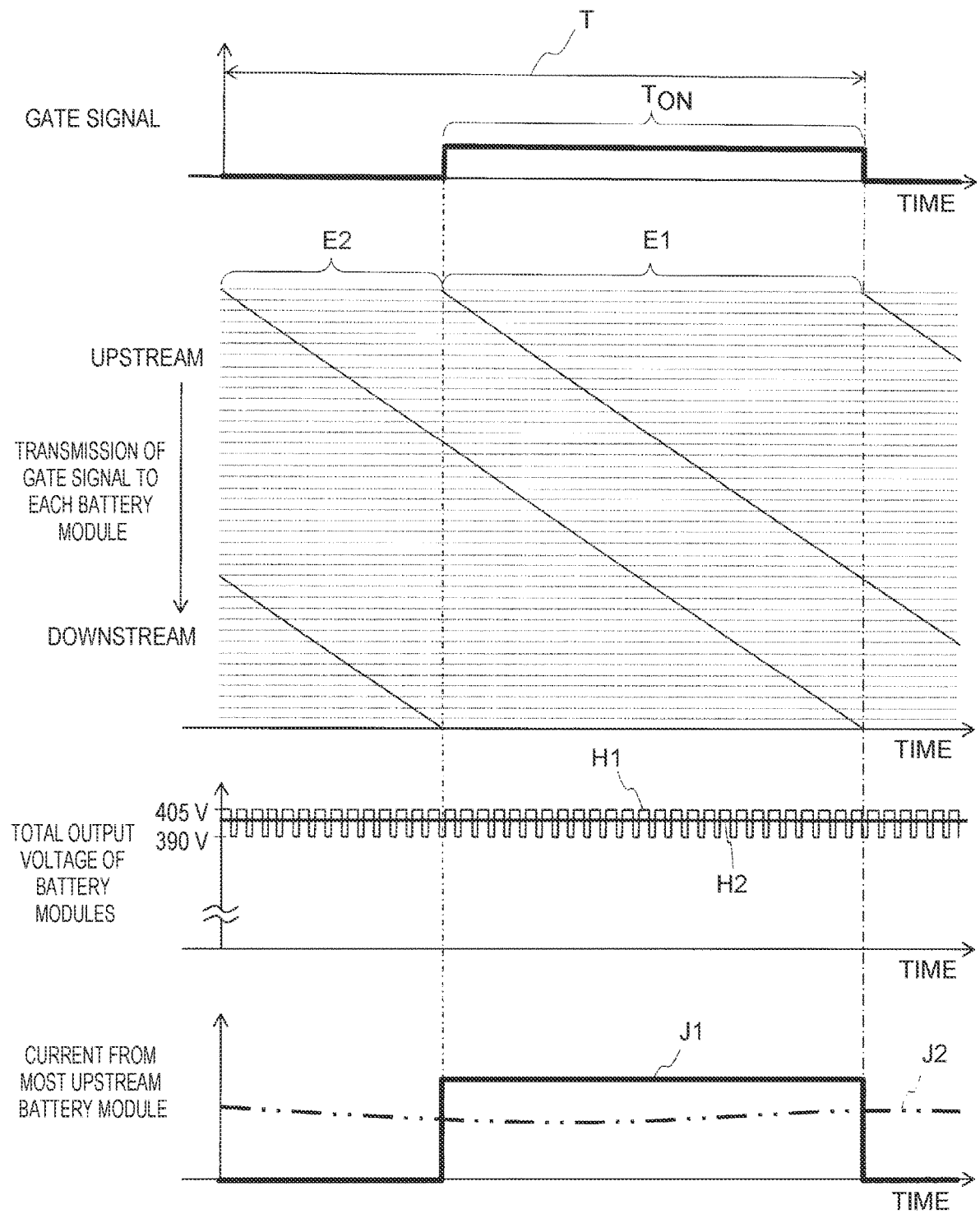
FIG. 4 is a time chart illustrating control of the power supply device in the embodiment of the present disclosure.

FIG. 4 shows a sequence of control under which electric power is output by sequentially connecting in series a predetermined number of battery modules among the battery modules 102a, 102b, . . . 102n. As shown in FIG. 4, the battery modules 102a, 102b, . . . 102n are driven according to the gate driving signal, one after another from an upstream side toward a downstream side, each with a delay of a certain time. In FIG. 4, a period E1 represents a state in which the first switch elements 16 are off and the second switch elements 18 are on in the battery modules 102, 102b, . . . 102n, and the battery modules 102a, 102b, . . . 102n are outputting a voltage from the output terminals (connected state). A period E2 represents a state in which the first switch elements 16 are on and the second switch elements 18 are off in the battery modules 102a, 102b, . . . 102n, and the battery modules 102a, 102b, . . . 102n are not outputting a voltage from the output terminals (pass-through state). Thus, the battery modules 102a, 102b, . . . 102n are sequentially driven, each with a delay of a certain time.

Settings of the gate driving signal and the delay time will be described with reference to FIG. 4. A cycle T of the gate driving signal is set by adding up the delay times of the respective battery modules 102a, 102b, . . . 102n. Therefore, setting a longer delay time results in a lower frequency of the gate driving signal. Conversely, setting a shorter delay time results in a higher frequency of the gate driving signal. The delay time by which the gate driving signal is delayed can be appropriately set according to the required specifications of the power supply device 100.

An on-time ratio D (on-duty) during the cycle T of the gate driving signal, i.e., a ratio of a time $T_{ON}$ for which the gate driving signal is at a high (H) level relative to the cycle T, is calculated by: the output voltage of the power supply device 100/the total voltage of the battery modules 102a, 102b, . . . 102n (the battery voltage of the battery module 102×the number of the battery modules). Thus, the on-time ratio D=(the output voltage of the power supply device 100)/(the battery voltage of the battery module 102×the total number of the battery modules 102). To be exact, the on-time ratio deviates by an amount corresponding to the dead time dt, and therefore it is preferable to correct the on-time ratio by feed-back or feed-forward, as commonly practiced for chopper circuits.

As described above, the output voltage of the power supply device 100 is represented by a value obtained by multiplying the battery voltage of the battery module 102 by the number of the battery modules 102 in the connected state. If the output voltage of the power supply device 100 has a value that can be evenly divided by the battery voltage of one battery module 102, the moment one battery module 102 switches from the pass-through state to the connected state, another battery module 102 switches from the connected state to the pass-through state, so that the total output voltage of the battery modules 102 does not vary.

However, if the output voltage of the power supply device 100 has a value that cannot be evenly divided by the battery voltage of the battery module 102, the output voltage of the power supply device 100 (total output voltage) varies. In this case, the amplitude of the variation corresponds to the voltage of one battery module, and the period of the variation corresponds to: the cycle T of the gate driving signal/the total number of the battery modules 102. Increasing the total number of the battery modules 102 can make the value of parasitic inductance in the entire power supply device 100 larger, so that this voltage variation is filtered out and the output voltage of the power supply device 100 can be stabilized.

Next, a specific example will be described. In FIG. 4, it is assumed, for example, that the desired output voltage of the power supply device 100 as a whole is 400 V; the battery voltage of each battery module 102 is 15 V; the number of the battery modules 102a, 102b, . . . 102n is 40; and the delay time is 200 ns. This case corresponds to a case where the output voltage (400 V) of the power supply device 100 cannot be evenly divided by the battery voltage (15 V) of the battery module 102.

Based on these numerical values, the cycle T of the gate driving signal is calculated by the delay time x the total number of battery modules as follows: 200 ns×40 =8 μs. Therefore, the gate driving signal is a rectangular wave with a frequency equivalent to 125 kHz. The on-time ratio D of the gate driving signal is calculated by the output voltage of the power supply device 100/(the battery voltage of the battery module 102×the total number of battery modules 102) as follows: 400 V/(15 V×40)≈0.67.

When the battery modules 102a, 102b, . . . 102n are sequentially driven based on these numerical values, an output voltage H1 with a rectangular waveform in FIG. 4 is produced by the power supply device 100 as a whole. This output voltage H1 varies between 390 V and 405 V. Specifically, the output voltage H1 varies in cycles calculated by: the cycle T of the gate driving signal/the total number of battery modules, i.e., 8 μs/40 =200 ns (equivalent to 5 MHz). This variation is filtered out by the parasitic inductance due to the wiring of the battery modules 102a, 102b, . . . 102n, so that the power supply device 100 as a whole produces an output voltage H2 of about 400 V.

A current flows through the capacitor 14 of each battery module 102 when the battery module 102 is in the connected state, and a capacitor current waveform J1 is a rectangular waveform as shown in FIG. 4. Since the battery 10 and the capacitor 14 form an RLC filter, a current J2 that has been filtered and smoothed flows through the power supply device 100. Thus, the current waveform is uniform in all the battery modules 102a, 102b, . . . 102n, and a current can be output evenly from all the battery modules 102a, 102b, . . . 102n.

As has been described above, to control the power supply device 100, the gate driving signal output to the most upstream battery module 102a is output to the downstream battery module 102b with a delay of a certain time, and this gate driving signal is further sequentially transmitted to the downstream battery modules 102, each time with a delay of a certain time, so that the battery modules 102a, 102b, . . . 102n sequentially output a voltage, each with a delay of a certain time. These voltages are added up to a voltage that is output from the power supply device 100 as a whole. Thus, a desired voltage can be output from the power supply device 100.

The power supply device 100 can eliminate the need for a boosting circuit and thereby simplify the configuration of the power supply circuit. Moreover, the power supply device 100 can achieve downsizing and cost reduction. By eliminating the need for a balancing circuit etc. that incurs electric power loss, the power supply device 100 can achieve higher efficiency. Since the voltage is output substantially evenly from the battery modules 102a, 102b, . . . 102n, it is unlikely that a specific battery module 102 is intensively driven, so that the internal resistance loss in the power supply device 100 can be reduced.

It is possible to easily meet a desired voltage by adjusting the on-time ratio D, which improves the versatility of the power supply device 100. In particular, even when some of the battery modules 102a, 102b, . . . 102n have failed and become difficult to use, one can obtain a desired voltage by re-setting the cycle T of the gate driving signal, the on-time ratio D, and the delay time while excluding the failed battery modules 102 and using normal battery modules 102. This means that a desired voltage can be continuously output even when some of the battery modules 102a, 102b, . . . 102n have failed.

When the delay time by which the gate driving signal is delayed is set longer, the frequency of the gate driving signal becomes lower, and so does the switching frequency of the first switch element 16 and the second switch element 18, which results in a smaller switching loss and higher power conversion efficiency. Conversely, when the delay time by which the gate driving signal is delayed is set shorter, the frequency of the gate driving signal becomes higher, and so does the frequency of the voltage variation, which makes the variation easy to filter out to obtain a stable voltage. It also becomes easy to smooth out a current variation by the RLC filter. Thus, it is possible to provide a power supply device 100 according to the required specifications and performance by adjusting the delay time by which the gate driving signal is delayed.

While this embodiment has adopted the configuration in which the gate driving signal processing circuit 20 is provided in each battery module 102 and the gate driving signal is transmitted while being delayed, the present disclosure is not limited to this configuration. For example, a configuration in which the gate driving signal processing circuit 20 is not provided in each battery module 102 may be adopted. In this case, the gate driving signal can be separately output from the controller 104 to the AND element 22 and the OR element 24 of each battery module 102. Specifically, the gate driving signal is output from the controller 104 to the battery modules 102a, 102b, . . . 102n at regular time intervals. In this case, the number of those of the battery modules 102a, 102b, . . . 102n that are put in the connected state is controlled by outputting the gate driving signal to the battery modules 102a, 102b, . . . 102n in an arbitrary order at regular time intervals, regardless of the positions of the battery modules 102a, 102b, . . . 102n. For example, this control can be performed such that the gate driving signal is first output to the battery module 102b to drive the battery module 102b, and after a certain time, the gate driving signal is output to the battery module 102a to drive the battery module 102a.

This configuration can eliminate the need for the gate driving signal processing circuit 20. Thus, the configuration of the power supply device 100 can be further simplified, and the manufacturing cost and electric power consumption can be reduced.

Forced Isolation Control

Next, control of forcibly isolating a selected one or selected ones of the battery modules 102 (102a, 102b, . . . 102n) will be described. The controller 104 outputs the forced disconnection signal to the gate driving signal processing circuit 20 of the battery module 102 to be forcibly isolated. Upon receiving the forced disconnection signal, the gate driving signal processing circuit 20 outputs a low (L)-level control signal to each of the AND element 22 and the OR element 24 belonging to the corresponding battery module 102. As a result, a low (L) level is output from the AND element 22, and through the OR element 24, a high (H) level is input into the gate terminal of the first switch element 16 by the NOT element 26 and a low (L) level is input into the gate terminal of the second switch element 18. Thus, the first switch element 16 is put in a normally on state and the second switch element 18 is put in a normally off state, which puts the corresponding battery module 102 in a state of being forcibly isolated regardless of the state of the gate driving signal (pass-through state).

Figure 5:
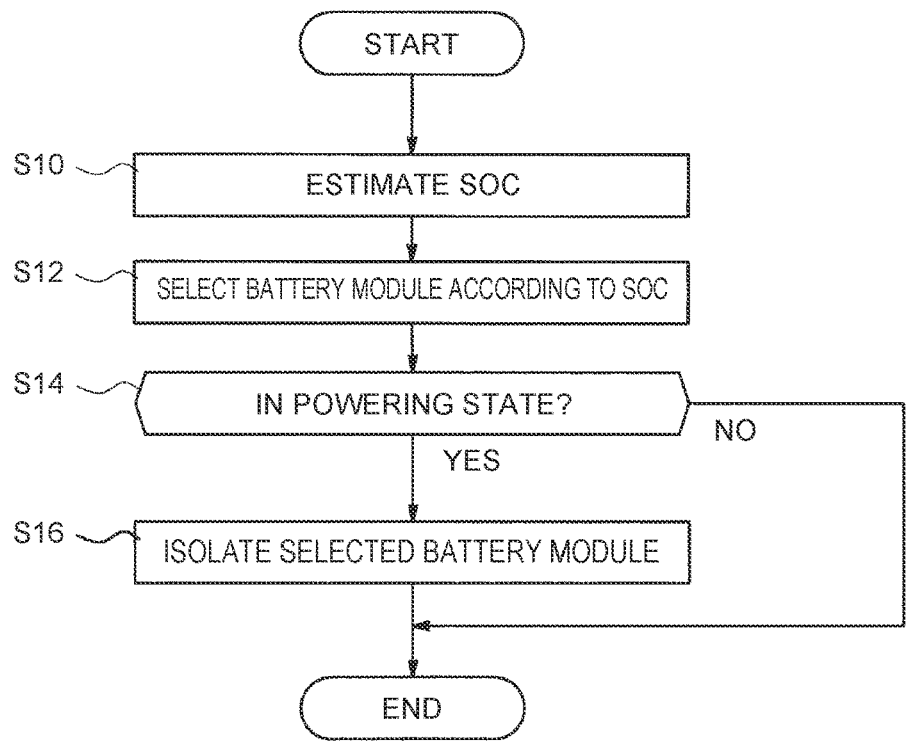
FIG. 5 is a flowchart of forced disconnection control in a powering state in the embodiment of the present disclosure.

Such forced isolation control can be used as control for reducing imbalance in the SOC among the battery modules 102 in the power supply device 100. FIG. 5 is a flowchart of SOC balance adjusting control. In the following, control for reducing imbalance in the SOC among the battery modules 102 in a powering state will be described with reference to FIG. 5.

In step S10, the states-of-charge of all the battery modules 102 included in the power supply device 100 are estimated. A battery operation monitoring circuit 104c of the controller 104 receives outputs from a voltage sensor 30 that is provided in each battery module 102 and detects and outputs an output voltage of the battery module 102, a current sensor 32 that detects and outputs an output current of the power supply device 100, and a voltage sensor 34 that detects and outputs an output voltage of the power supply device 100. Based on the received data, a SOC control value calculating circuit 104b performs a process of estimating the SOC of each battery module 102. Based on the estimated states-of-charge of the battery modules 102, the SOC control value calculating circuit 104b sets an SOC control target value that is a target value for the SOC of the power supply device 100. The process of estimating the SOC and the process of setting the SOC control target value will be described later.

In step S12, the states-of-charge of the battery modules 102 are compared and a battery module 102 with a relatively low SOC is selected. The controller 104 compares the states-of-charge of the battery modules 102 estimated in step S10, and selects a battery module 102 with a relatively low SOC from all the battery modules 102.

For example, a battery module 102 with an SOC equal to or lower than the SOC control target value can be selected. Alternatively, a predetermined number of battery modules 102 can be selected in increasing order of the SOC from all the battery modules 102 included in the power supply device 100. However, the method of selecting the battery modules 102 is not limited to these examples, and any method that is effective in reducing imbalance in the SOC can be used.

In step S14, it is determined whether the electric power output of the power supply device 100 is in a powering state or a regenerating state. The controller 104 determines, from the direction of the current detected by the current sensor 32, whether the power supply device 100 is in the powering state in which electric power is supplied from the power supply device 100 to a load or in the regenerating state in which electric power is input from an external power source into the power supply device 100. The controller 104 moves to step S16 if the power supply device 100 is in the powering state, and ends the process if the power supply device 100 is in the regenerating state.

In step S16, the process of forcibly isolating the selected battery module 102 is performed. The controller 104 outputs the forced disconnection signal to the gate driving signal processing circuit 20 of the battery module 102 selected in step S12. Upon receiving the forced disconnection signal, the gate driving signal processing circuit 20 outputs a low (L)-level control signal to the corresponding AND element 22 and outputs a low (L)-level control signal to the corresponding OR element 24. As a result, the selected battery module 102 is forcibly isolated from the series connection and stops contributing to the output of the power supply device 100.

This control can resolve the imbalance in the SOC as the amount of electric power consumed by (an integrated amount of current discharged per unit time) a battery module 102 with a relatively low SOC among the battery modules 102 included in the power supply device 100 is reduced. As a result, the states-of-charge of the battery modules 102 included in the power supply device 100 can be brought closer to the SOC control target value. Moreover, energy charged to the battery modules 102 can be efficiently used up.

The control for resolving imbalance in the SOC can also be performed while the power supply device 100 is in the regenerating state and not in the powering state. In this case, control of forcibly isolating a battery module 102 with a relatively high SOC is performed, and a battery module 102 with a relatively low SOC is preferentially charged with regenerated electric power, to thereby resolve imbalance in the SOC.

Figure 6:
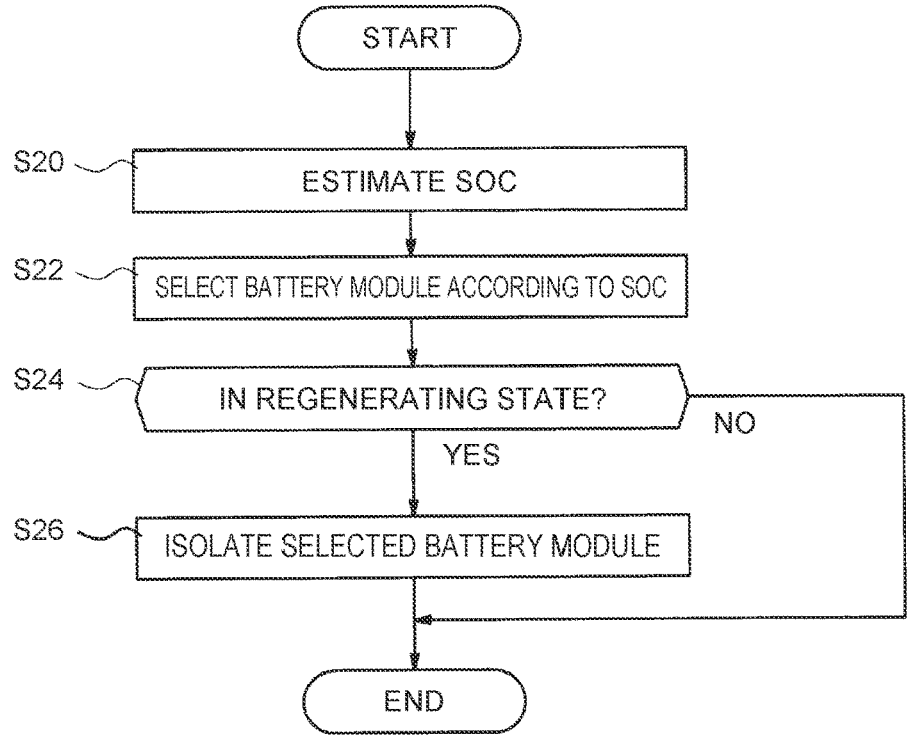
FIG. 6 is a flowchart of forced disconnection control in a regenerating state in the embodiment of the present disclosure.

FIG. 6 is a flowchart of SOC balance adjusting control. In the following, control for reducing imbalance in the SOC among the battery modules 102 in the regenerating state will be described with reference to FIG. 6.

In step S20, the states-of-charge of all the battery modules 102 included in the power supply device 100 are estimated. This process can be performed in the same manner as in step S10 described above.

In step S22, the states-of-charge of the battery modules 102 are compared and a battery module 102 with a relatively high SOC is selected. The controller 104 compares the states-of-charge of the battery modules 102 estimated in step S20, and selects a battery module 102 with a relatively high SOC from all the battery modules 102

For example, a battery module 102 with an SOC equal to or higher than the SOC control target value can be selected. Alternatively, a predetermined number of battery modules 102 can be selected in decreasing order of the SOC from all the battery modules 102 included in the power supply device 100. However, the method of selecting the battery modules 102 is not limited to these examples, and any method that is effective in reducing imbalance in the SOC can be used.

In step S24, it is determined whether the electric power output of the power supply device 100 is in a powering state or a regenerating state. The controller 104 determines, from the direction of the current detected by the current sensor 32, whether the power supply device 100 is in the powering state in which electric power is supplied from the power supply device 100 to a load or in the regenerating state in which electric power is input from an external power source into the power supply device 100. The controller 104 moves to step S26 if the power supply device 100 is in the regenerating state, and ends the process if the power supply device 100 is in the powering state.

In step S26, the process of forcibly isolating the selected battery module 102 is performed. The controller 104 outputs the forced disconnection signal to the gate driving signal processing circuit 20 of the battery module 102 selected in step S22. Upon receiving the forced disconnection signal, the gate driving signal processing circuit 20 outputs a low (L)-level control signal to the corresponding AND element 22 and outputs a low (L)-level control signal to the corresponding OR element 24. As a result, the selected battery module 102 is forcibly isolated from the series connection and stops being supplied with regenerated electric power to the power supply device 100.

This control can resolve imbalance in the SOC as an amount of electric power supplied (an integrated amount of current charged per unit time) to a battery module 102 with a relatively high SOC among the battery modules 102 included in the power supply device 100 is reduced. As a result, the states-of-charge of the battery modules 102 included in the power supply device 100 can be brought closer to the SOC control target value. Moreover, all the battery modules 102 included in the power supply device 100 can be charged in a well-balanced manner. Furthermore, excessive charging of a battery module 102 with a small charging capacity can be prevented.

Forced Connection Control

Next, control of forcibly connecting a selected one or selected ones of the battery modules 102 (102a, 102b, . . . 102n) will be described. The controller 104 outputs the forced connection signal to the gate driving signal processing circuit 20 of the battery module 102 to be forcibly connected. Upon receiving the forced connection signal, the gate driving signal processing circuit 20 outputs a high (H)-level control signal to the OR element 24 belonging to the corresponding battery module 102.

As a result, a high (H) level is output from the OR element 24, a low (L) level is input into the gate terminal of the first switch element 16 by the NOT element 26, and a high (H) level is input into the gate terminal of the second switch element 18. Thus, the first switch element 16 is put in a normally off state and the second switch element 18 is put in a normally on state, which puts the battery module 102 in a state of being forcibly linked to the series connection regardless of the state of the gate driving signal.

Figure 7:
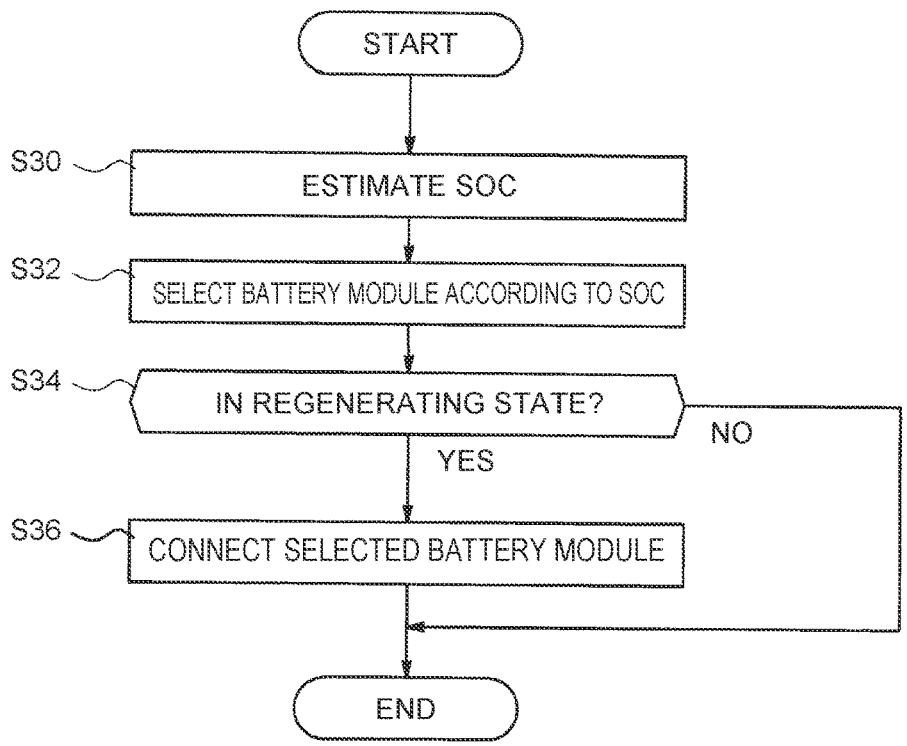
FIG. 7 is a flowchart of forced connection control in a regenerating state in the embodiment of the present disclosure.

Such forced connection control can be used as control for reducing imbalance in the SOC among the battery modules 102 in the power supply device 100. FIG. 7 is a flowchart of SOC balance adjusting control. In the following, control for reducing imbalance in the SOC among the battery modules 102 in a regenerating state will be described with reference to FIG. 7.

In step S30, the states-of-charge of all the battery modules 102 included in the power supply device 100 are estimated. This process can be performed in the same manner as step S10 described above.

In step S32, the states-of-charge of the battery modules 102 are compared and a battery module 102 with a relatively low SOC is selected. The controller 104 compares the states-of-charge of the battery modules 102 estimated in step S30, and selects a battery module 102 with a relatively low SOC from all the battery modules 102. Specifically, this process can be performed in the same manner as the process in step S12 described above.

In step S34, it is determined whether the electric power output of the power supply device 100 is in a powering state or a regenerating state. The controller 104 determines, from the direction of the current detected by the current sensor 32, whether the power supply device 100 is in the powering state in which electric power is supplied from the power supply device 100 to a load or in the regenerating state in which electric power is input from an external power source into the power supply device 100. The controller 104 moves to step S36 if the power supply device 100 is in the regenerating state, and ends the process if the power supply device 100 is in the power state.

In step S36, the process of forcibly connecting the selected battery module 102 is performed. The controller 104 outputs the forced connection signal to the gate driving signal processing circuit 20 of the battery module 102 selected in step S32. Upon receiving the forced connection signal, the gate driving signal processing circuit 20 outputs a high (H)-level control signal to the corresponding OR element 24. As a result, the selected battery module 102 is forcibly connected in series and starts contributing to charging of the power supply device 100 with regenerated electric power.

This control can resolve the imbalance in the SOC as a battery module 102 with a relatively low SOC among the battery modules 102 included in the power supply device 100 is preferentially charged with regenerated electric power and the integrated amount of current charged per unit time is increased. As a result, the states-of-charge of the battery modules 102 included in the power supply device 100 can be brought closer to the SOC control target value. Moreover, all the battery modules 102 included in the power supply device 100 can be charged in a well-balanced manner.

The control for resolving imbalance in the SOC can also be performed while the power supply device 100 is in the powering state and not in the regenerating state. In this case, control of forcibly connecting a battery module 102 with a relatively high SOC is performed, and the amount of electric power consumed in the battery module 102 with a relatively high SOC is increased, to thereby resolve imbalance in the SOC.

Figure 8:
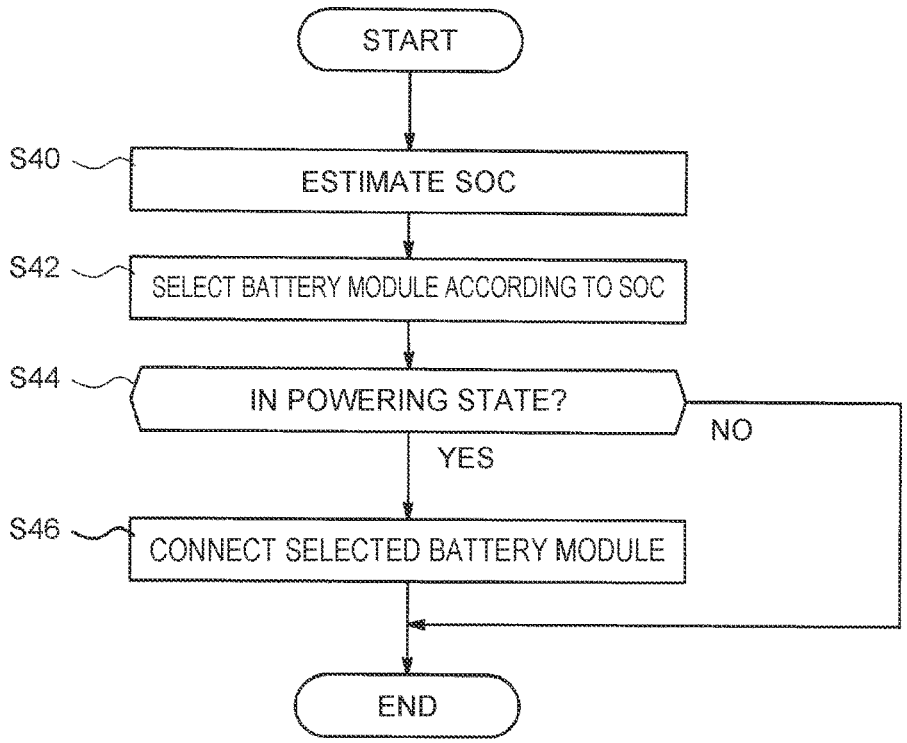
FIG. 8 is a flowchart of forced connection control in a powering state in the embodiment of the present disclosure.

FIG. 8 is a flowchart of SOC balance adjusting control. In the following, control for reducing imbalance in the SOC among the battery modules 102 in the powering state will be described with reference to FIG. 8.

In step S40, the states-of-charge of all the battery modules 102 included in the power supply device 100 are estimated. Specifically, this process can be performed in the same manner as in step S12 described above.

In step S42, the states-of-charge of the battery modules 102 are compared and a battery module 102 with a relatively high SOC is selected. The controller 104 compares the states-of-charge of the battery modules 102 estimated in step S40, and selects a battery module 102 with a relatively high SOC from all the battery modules 102. Specifically, this process can be performed in the same manner as in step S22 described above.

In step S44, it is determined whether the electric power output of the power supply device 100 is in a powering state or a regenerating state. The controller 104 determines, from the direction of the current detected by the current sensor 32, whether the power supply device 100 is in the powering state in which electric power is supplied from the power supply device 100 to a load or in the regenerating state in which electric power is input from an external power source into the power supply device 100. The controller 104 moves to step S46 if the power supply device 100 is in the powering state, and ends the process if the power supply device 100 is in the regenerating state.

In step S46, the process of forcibly connecting the battery module 102 is performed. The controller 104 outputs the forced connection signal to the gate driving signal processing circuit 20 of the battery module 102 selected in step S42. Upon receiving the forced connection signal, the gate driving signal processing circuit 20 outputs a high (H)-level control signal to the corresponding OR element 24. As a result, the selected battery module 102 is forcibly connected in series and starts contributing to the output of the power supply device 100.

This control can resolve imbalance in the SOC as an amount of electric power supplied (an integrated amount of current discharged per unit time) from a battery module 102 with a relatively high SOC among the battery modules 102 included in the power supply device 100 is increased. As a result, the states-of-charge of the battery modules 102 included in the power supply device 100 can be brought closer to the SOC control target value. Moreover, energy charged to all the battery modules 102 included in the power supply device 100 can be efficiently used up.

SOC Estimation Process

Figure 9:
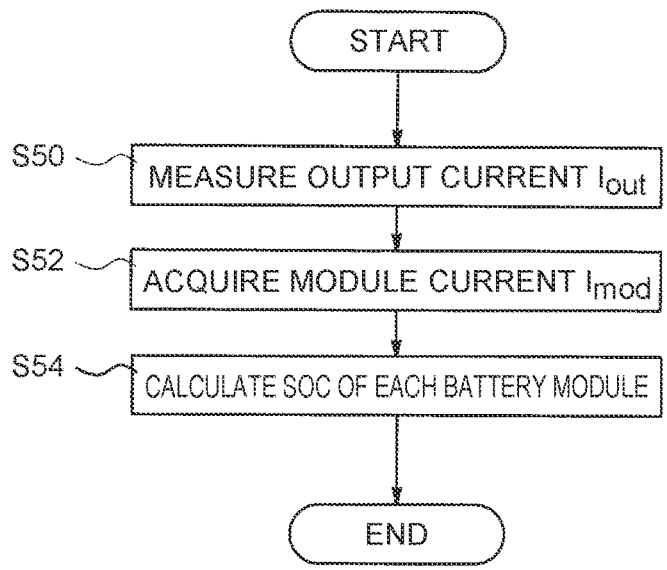
FIG. 9 is a flowchart of an SOC estimation method in the embodiment of the present disclosure.

The SOC estimation process in the power supply device 100 will be described below. FIG. 9 is a flowchart of the SOC estimation process in this embodiment.

In step S50, an output current Iout of the power supply device 100 is measured. The battery operation monitoring circuit 104c of the controller 104 acquires the output current Iout of the power supply device 100 measured by the current sensor 32.

In step S52, a process of estimating a module current Imod of each battery module 102 is performed. The battery operation monitoring circuit 104c acquires, from the voltage sensor 30, the output voltage (module voltage) Vmod [i] of each of those battery modules 102 that are currently connected in series, i.e., those battery modules 102 that are currently contributing to the output. Here, i represents an i-th battery module 102. The SOC control value calculating circuit 104b of the controller 104 calculates, based on the on-duty D, a current (module current) Imod from each of the battery modules 102 that are currently contributing to the output.

The on-duty D can be calculated by Formula (1). The module current Imod can be calculated by Formula (2).

$$D = \frac{Vout}{\sum_i Vmod[i]} \quad (1)$$

$$Imod = Iout \times D \quad (2)$$

While the process of calculating the module current Imod by using the on-duty D is performed in this embodiment, a configuration in which the current sensor 32 is provided in each battery module 102 and the module current Imod is directly measured may also be adopted.

In step S54, a process of calculating the SOC of each battery module 102 is performed. Based on the module current Imod obtained in step S52, the controller 104 calculates the SOC of each battery module 102 by using Formula (3). Here, Q [i] represents the full charging battery capacity of the i-th battery module 102, and SOCini [i] represents the initial SOC at the start of integration of the current (SOCv obtained based on an open-circuit voltage that is measured in a state where the charging or discharging current is zero upon startup of the power supply device 100 or upon isolation of the i-th battery module 102).

$$SOC[i] = SOC_{ini}[i] + \frac{\int Imod \cdot dt}{Q[i]} \times 100 \quad (3)$$

Figure 10A:
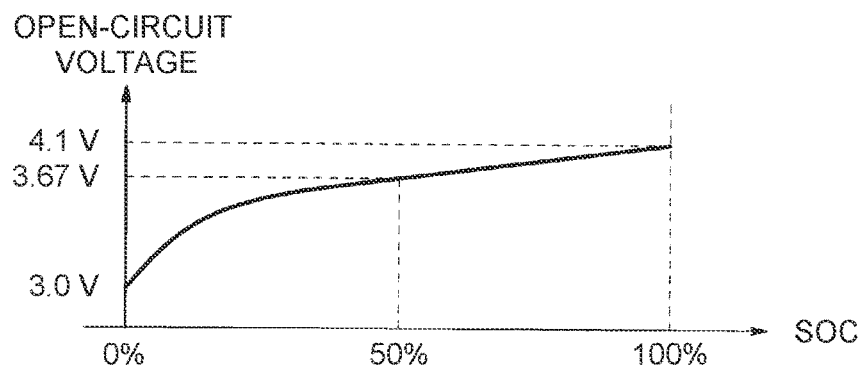
FIG. 10A is a graph showing a characteristic of the battery module.
Figure 10B:
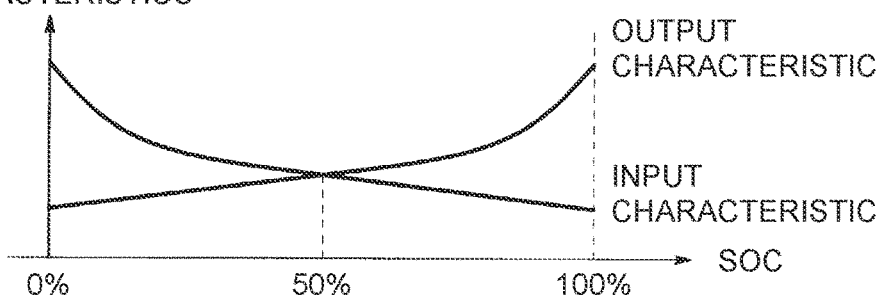
FIG. 10B is a graph showing characteristics of the battery module.

The relation between the open-circuit voltage of the battery module 102 and the SOC is a one-to-one relation as shown in FIG. 10A and FIG. 10B. Therefore, by measuring the open-circuit voltage of the i-th battery module 102, SOCini [i] can be obtained based on this open-circuit voltage.

How to measure the open-circuit voltage upon isolation of the battery module 102 will be described below. As described above, during normal control, the forced disconnection signals to all the battery modules 102 are set to a low (L) level. However, for example, under the condition where the on-duty D is low (the condition where the number of the battery modules 102 connected to a load need not be large, and where a required output voltage can be output even when there is a battery module 102 that is in a normally isolated state), the forced disconnection signal to a specific battery module 102 is set to a high (H) level. As a result, this specific battery module 102 is put in a state of being isolated from the load.

When the specific battery module 102 is isolated from the load, the module current Imod of this battery module 102 becomes zero. Therefore, the controller 104 can acquire the open-circuit voltage from the voltage sensor 30 of this battery module 102. Thus, based on the relation between the open-circuit voltage and the SOC in FIG. 10A, the controller 104 can obtain the SOC corresponding to the acquired open-circuit voltage.

The open-circuit voltage may be measured after a predetermined time has elapsed since the battery module 102 has been isolated from the load and thereafter the terminal voltage has stabilized, or may be estimated from a voltage before it stabilizes by using a voltage behavior model that shows the behavior of the voltage after charging or discharging has stopped, as in the related art.

Thus, even when electric power is being supplied to a load, the open-circuit voltage can be measured by isolating the battery module 102 from the load. The SOC of a specific battery module 102 can be obtained by using the measured open-circuit voltage, and this SOC can be substituted into SOCini [i] of Formula (3). In this case, it is preferable to reset the integration of the current of Formula (3) to zero.

In the estimation of an SOC based on the integrated value of the module current by Formula (3), errors tend to accumulate in the integrated value due to the influence of measurement errors of the current sensor 32 etc. However, the influence of such errors can be reduced by appropriately updating the initial value SOCini [i] based on the open-circuit voltage, and the SOC estimation accuracy can be thereby improved.

Process of Setting SOC Control Target Value

In the power supply device 100 in this embodiment, when an abnormality in a battery module 102 is detected for some reason (e.g., when the module voltage of the battery module 102 is decreasing significantly), the controller 104 forcibly isolates this battery module 102. Specifically, the controller 104 determines whether or not each battery module 102 has failed, based on state information acquired by the battery operation monitoring circuit 104c. For example, the controller 104 estimates the SOC of each battery module 102 based on the state information, and determines the battery module 102 to be in a failed state when the SOC thereof has decreased to or below a threshold value. Then, the controller 104 performs the process of forcibly isolating the battery module 102 that has been determined to have failed.

Thus, with only the battery modules 102 other than the battery module 102 in which an abnormality has been detected, the power supply device 100 can be continuously used. However, when the number of the battery modules 102 that are determined to be abnormal has become large, current control over the power supply device 100 may become impossible and an output may fail to be secured.

When the battery 10 used in each battery module 102 is a lithium-ion battery, the open-circuit voltage changes with the SOC of the battery module 102. In this case, the battery module 102 has a characteristic that the open-circuit voltage becomes higher as the SOC becomes higher. When the lithium-ion battery has one single cell, the open-circuit voltage is 3.0 V at 0% SOC and 4.1 V at 100% SOC as shown in FIG. 10A. This means that when the battery 10 is a lithium-ion battery having, for example, ten single cells connected in series, the open-circuit voltage of the battery module 102 changes from 30 V to 41 V in the SOC range of 0% to 100%.

As shown in FIG. 10B, the input and output performances of the battery module 102 depend on the SOC, and have characteristics that the output performance becomes higher as the SOC becomes higher and that the input performance becomes higher as the SOC becomes lower. To secure both the output and input performances in good balance, therefore, it is generally desirable to control the power supply device 100 with the SOC control target value set around 50%.

When the battery 10 is a lithium-ion battery, the cell voltage is about 3.67 V at 50% SOC. Thus, the open-circuit voltage of the battery module 102 having ten single cells connected in series is 36.7 V.

Here, a configuration will be considered in which the power supply device 100 having ten series-connected battery modules 102, each having ten series-connected lithium-ion battery cells, is connected to a 300 V load (DC bus). In this configuration, the average number of the battery modules 102 of the power supply device 100 to be connected to produce an output voltage of 300 V is: 300 V/36.7 V≈8.174. Therefore, the on-duty D of the gate driving signal is adjusted and the battery modules 102 are thereby controlled such that either eight or nine battery modules 102 are in the connected state and that on average 8.174 battery modules 102 are connected.

In this case, even when one of the ten battery modules 102 has failed and been forcibly isolated, a state where eight or nine battery modules 102 are connected in series can be created by using the other nine battery modules 102. Thus, the power supply device 100 can secure the output voltage required by the load. However, if two of the battery modules 102 have failed, only eight battery modules 102 will be left to be used. In this case, the voltage produced by connecting all the battery modules 102 is only 36.7 V×8=293.6 V, lower than the voltage required by the load, making it impossible to control the output current. As a result, the power supply device 100 may need to be stopped.

To avoid this situation, the power supply device 100 of the embodiment performs a process of changing the SOC control target value according to the number of the battery modules 102 that are available to be connected in series. Those battery modules 102 that have been forcibly isolated from the series connection are excluded from the battery modules 102 that are available to be connected in series, and the SOC control target value is set higher as the number of the battery modules 102 that are available to be connected in series becomes smaller.

Figure 11A:
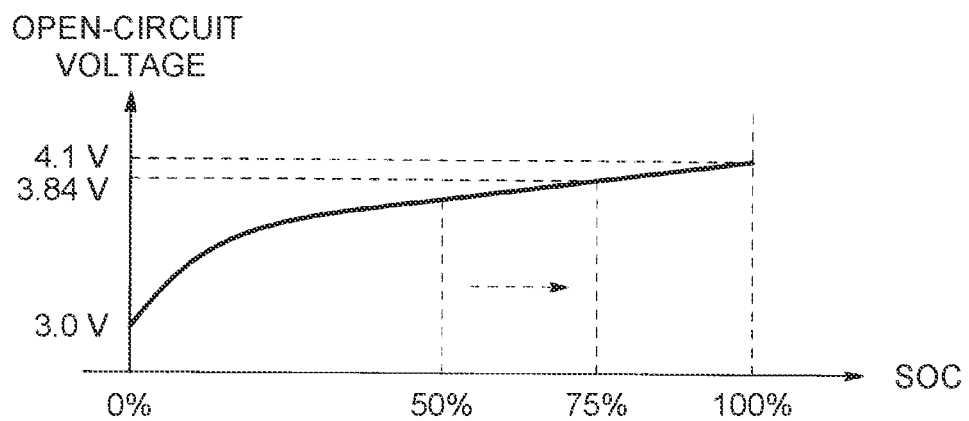
FIG. 11A is graphs for illustrating a process of setting an SOC control target value.
Figure 11B:
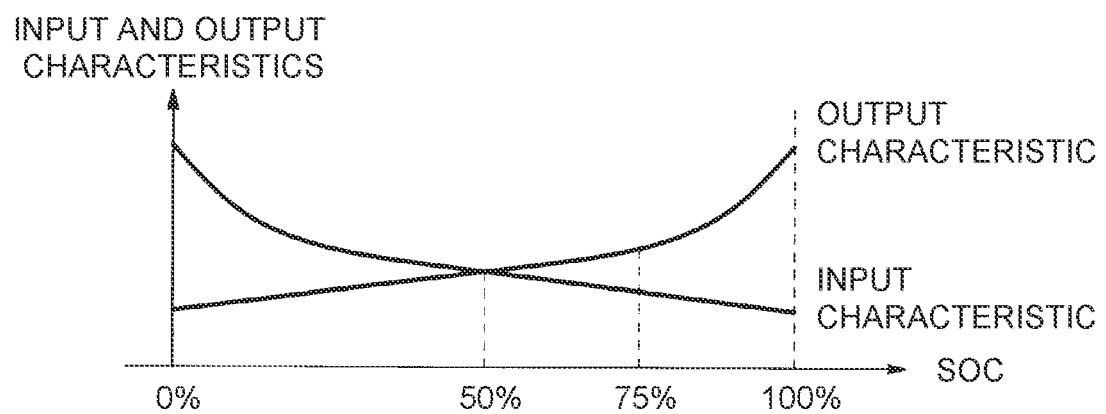
FIG. 11B is graphs for illustrating a process of setting an SOC control target value.

Specifically, as shown in FIGS. 11A and 11B, when one battery module 102 is determined to have failed, the SOC control target value is set higher than a current value in case another battery module 102 fails next. For example, the SOC control target value is set to 75% (3.84 V as the output voltage of a single cell and 38.4 V as the module voltage of the battery module 102), and control is performed such that the states-of-charge of the battery modules 102 of the power supply device 100 meet the SOC control target value.

Thus, the states-of-charge of the battery modules 102 rise so as to meet the SOC control target value. The open-circuit voltage of the battery module 102 approaches 38.4 V accordingly. The control of shifting the SOC control target value is preferably performed when charging the power supply device 100 will cause no problem.

When the SOC reaches 75%, the average number of the battery modules 102 to be connected to secure an output voltage of 300 V is: 300 V/38.4 V=7.81. Therefore, seven or eight battery modules 102 should be connected. Then, even if it becomes necessary to forcibly isolate two battery modules 102, the power supply device 100 can be continuously used.

As has been described above, it is possible to continuously use the power supply device 100 by setting the SOC control target value such that the total value of the voltages of the battery modules 102 that are available to be connected in series becomes equal to or higher than the target output voltage value.

When the number of the battery modules 102 that are available to be connected in series has increased, the SOC control target value may be set lower according to the increase. For example, the SOC control target value is set lower than a current value when a battery module 102 that has failed and therefore been forcibly isolated is replaced with a new battery module 102 and this new battery module 102 is restored as one of the battery modules 102 that are available to be connected in series. Thus, the states-of-charge of the battery modules 102 can be controlled so as to achieve an SOC value that allows a good balance between the input and output characteristics.

What is claimed is:

1. A power supply device comprising:
    a plurality of battery modules wherein the plurality is a given number of battery modules, each battery module having a secondary battery;
    a controller configured to connect the battery modules in series with one another according to a gate driving signal, and to change an SOC control target value that is a target value for states-of-charge of the battery modules according to the given number of the battery modules that are available to be connected in series; and
    a disconnecting device that forcibly isolates the battery module from a series connection regardless of the gate driving signal;
    wherein the controller is configured to exclude, from the battery modules that are available to be connected in series, the battery module that has been forcibly isolated from the series connection by the disconnecting device; and
wherein:
    the controller is configured to determine whether or not the battery module is in a failed state by using state information showing a state of the battery module; and
    the disconnecting device forcibly isolates, from the series connection, the battery module that has been determined to be in the failed state.

2. The power supply device according to claim 1, wherein the controller is configured to set the SOC control target value higher as the number of the battery modules that are available to be connected in series becomes smaller.

3. The power supply device according to claim 1, wherein the controller is configured to estimate SOC of each of the battery modules based on the state information; to determine the battery module whose SOC has decreased to or below a threshold value to be in a failed state; and to set the SOC control target value such that a total value of voltages of the battery modules that are available to be connected in series, except for the battery module that has been forcibly isolated by the disconnecting device, becomes equal to or larger than a target output voltage value.

4. The power supply device according to claim 1, wherein the gate driving signal is transmitted to the battery modules, from an upstream side toward a downstream side, while being delayed in a gate driving signal processing circuit included in each of the battery modules.

5. A power supply device comprising:
    a plurality of battery modules wherein the plurality is a given number of battery modules, each battery module having a secondary battery; and
    a controller configured to connect the battery modules in series with one another according to a gate driving signal, and to change an SOC control target value that is a target value for states-of-charge of the battery modules according to the given number of the battery modules that are available to be connected in series;
    wherein the controller is configured to change the SOC control target value such that a total value of voltages of the battery modules that are available to be connected in series becomes equal to or higher than a target output voltage value of the power supply device.

* * * * *